United States Patent [19]
Liao et al.

[11] Patent Number: 6,096,579
[45] Date of Patent: Aug. 1, 2000

[54] METHOD FOR CONTROLLING THE THICKNESS OF A PASSIVATION LAYER ON A SEMICONDUCTOR DEVICE

[75] Inventors: Wen-Shiang Liao, Miao Li; Wan-Yih Lien, Hsinchu, both of Taiwan

[73] Assignee: Vanguard International Semiconductor Corporation, Hsinchu, Taiwan

[21] Appl. No.: 09/276,260

[22] Filed: Mar. 25, 1999

[51] Int. Cl.$^7$ .................................................... H01L 21/82
[52] U.S. Cl. .......................... 438/131; 438/128; 438/132
[58] Field of Search .................................. 438/131, 132, 438/128

[56] References Cited

U.S. PATENT DOCUMENTS

| | | |
|---|---|---|
| 5,223,080 | 6/1993 | Ohta et al. . |
| 5,578,517 | 11/1996 | Yoo et al. . |
| 5,753,539 | 5/1998 | Okazaki . |
| 5,930,664 | 7/1999 | Hsu et al. . |

*Primary Examiner*—Kevin M. Picardat
*Assistant Examiner*—D. M. Collins
*Attorney, Agent, or Firm*—Christensen O'Connor Johnson & Kindness PLLC

[57] ABSTRACT

A method for controlling the thickness of a passivation layer underlying with a fuse on a semiconductor device is disclosed herein. The anti-reflective coating on a metal layer is buried in the passivation layer, and the fuse is in a semiconductor device. The method includes the following steps. First, use a first etchant and Ar to etch the passivation layer till the anti-reflective coating is exposed, the first thickness of the passivation layer above the anti-reflective coating is smaller than the second thickness of the passivation layer above the fuse. Then, utilize a second etchant to etch the anti-reflective coating till the metal layer is exposed. The second etchant has a selectivity ratio from the anti-reflective coating to the passivation layer being at least 10. The second etchant mentioned above includes $BCl_3$, $Cl_2$, $O_2$, and Ar.

20 Claims, 5 Drawing Sheets

METHOD FOR CONTROLLING THE THICKNESS OF A PASSIVATION LAYER ON A SEMICONDUCTOR DEVICE

BACKGROUND OF THE INVENTION

1. Field of the Invention

This invention relates to a method for controlling the thickness of a passivation layer on a semiconductor device, and particularly relates to a method using only one photo mask for controlling the thickness of a passivation layer underlying with a fuse on a dynamic random access memory.

2. Description of the Prior Art

Redundant cells can be added to a memory design to replace defective cells, which are identified by an electrical test after wafer processing. Fuses incorporated on the wafer can be blown by the incident laser energy to swamp defective cells, so redundant cells are widely used in fabricating the semiconductor device.

In fabricating the memory cell, a passivation layer such as CVD silicon oxide or plasma enhanced CVD silicon nitride is laid down on the wafer surface. This passivation layer seals the device structures on the wafer from contaminants and moisture, and also serves as a scratch protection layer. The passivation layer is deposited over the entire chip surface of the wafer to protect the devices in the wafer. This is an insulating, protective layer that prevents mechanical and chemical damage during assembling and packaging.

As shown in FIG. 1, a cross-sectional view of a typical wafer of a memory cell with an embedded fuse in the wafer. The layers are, from bottom to top, as follows. The field oxide layer 1 formed on the Si-substrate is about 2150 angstroms in thickness, the thickness of the TEOS oxide layer 2 formed on the field oxide layer 1 is about 1000 angstroms. The thickness of the IPO1 (Inter poly-Si Oxide) BPSG layer 3 formed on the TEOS oxide layer 2 is about 5100 angstroms, and the IPO1-1 BPSG layer 4 formed on the IPO1 BPSG layer 3 is about 1000 angstroms in thickness.

The thickness of the poly-2 fuse layer 5 formed on the IPO1-1 BPSG 4 is about 1500 angstroms in thickness, the IPO2 BPSG layer 6 formed on the poly-2 fuse layer 5 is about 4000 angstroms in thickness. The ILD (Inter Layer Dielectric) layer 7 formed on the IPO2 BPSG layer 6 is about 11000 angstroms in thickness, and the metal barrier Ti layer 8 formed on the ILD layer 7 is about 1000 angstroms in thickness. The TiN layer 9 formed on the Metal barrier Ti layer 8 is about 600 angstroms in thickness, and the first metal layer 10 is formed on the TiN layer 9. The first anti-reflective coating 11 formed on the first metal layer 10 is about 300 angstroms, and the anti-reflective coating 11 is used to improve the precision of alignment in exposing the first metal layer 10. The thickness of the IMD (Inter Metal Dielectric) layer 12 formed on the first anti-reflective coating 11 is about 11000 angstroms in thickness. The first metal layer 10 is usually made of the AlCu alloy, and the first anti-reflective coating 11 is frequently formed of TiN in the prior art method of fabricating memory cells.

Next, the photoresist is applied on the topography of the wafer and is developed to form the photoresist mask by using photo mask (not shown). Then the photoresist pattern 13 is formed and the oxide etchant 14 is used to etch the portion of the IMD layer that is not covered by the photoresist pattern 13 to fabricate the via contact 15 and the fuse window 19 simultaneously. The ILD layer 7 as well as the IPO2 BPSG layer 6 are etched in the forgoing etching step. According to the prior art of forming the via contact 15, the recipe used to etch the IMD layer 12 is the etchant including $C_4F_8$, $CF_4$, Ar and $CHF_3$. In order to remove a portion of the first anti-reflective coating 11, the etchant including $C_4F_8$, $CF_4$, Ar and $CHF_3$ are used to etch the portion of the first anti-reflective coating 11. When the Ar together with the $C_4F_8$, $CF_4$ and $CHF_3$ are used as the oxide etchant 14 to etch the first anti-reflective coating 11, the etching rate of the exposed oxide is about 5000–6000 angstroms per minute. Because the momentum of the Ar in etching the first anti-reflective coating 11 is very large, so that the atoms in the first anti-reflective coating 11 will be removed, and the oxide loss of the IMD layer 12 is more than about 5000 angstroms in thickness. As noted that, in fabricating the via contact 15 and the fuse window 19 simultaneously using one etching step, the oxide loss due to the traditional recipe gives rise to a problem of controlling the thickness of the oxide fuse window 19.

In the other respect, when the wafer is used to fabricate the structure mentioned above with a raised fuse, the cross sectional view of the wafer is similar to the structure of the wafer shown in FIG. 1. The cross sectional view of the portion of wafer shown in FIG. 2A is for containing a raised fuse, and the cross sectional view of the portion of wafer shown in FIG. 2B is for fabricating the bonding pad. A mask called the "pad mask" or "bonding contact mask" is used to define patterns corresponding to the regions in which electrical contact to the finished circuit will be made. These patterns in a resist layer allow openings in the passivation layer to be etched down to metal areas on the circuit called "bonding pads." Openings are etched into the passivation layer so that a set of metallization patterns under the passivation layer is exposed. These metal patterns are normally located in the periphery of the circuit and are called bonding pads. Wires are connected (bonded) to the metal of the bonding pads and are also bonded to the chip package.

The cross-sectional views of the portions of the wafer shown in FIGS. 2A and 2B illustrate the wafer with the raised fuse when etching the second anti-reflective coating 30 (FIG. 2B) on the metal pattern. The second anti-reflective coating 30 is on the second metal layer 29 (FIGS. 2A and 2B), and the function of the second anti-reflective coating 30 is the same as that of the anti-reflective coating 11 shown in FIG. 1. The portion of the wafer shown in FIG. 2A has a field oxide layer 20 on the Si substrate. The IPO (Inter Poly Oxide) layer 21 is formed on the field oxide layer 20 and the Si substrate. The ILD (Inter Layer Dioxide) layer 22 is formed on the IPO layer 21; the first metal layer 23 is patterned on the ILD layer 22, and the IMD (Inter Metal Dioxide) layer 24 is formed on the patterned first metal layer 23. Subsequently, the second metal layer 29 and the second anti-reflective coating 30 are patterned on the IMD layer 24.

Next, the silicon nitride layer 39 is deposited on the topography of the wafer, and then the polyimide layer 42 is patterned on the wafer. Subsequently, the patterned polyimide layer 42 is used as a mask when using silicon nitride etchant $CF_4$, $CHF_3$, and Ar together with $N_2$ as an etchant 45, which is similar to an oxide etchant, to etch the silicon nitride layer 39. As shown in FIGS. 2A and 2B, the exposed silicon nitride layer 39 is removed, and the spacer 47 is formed on the side walls of the raised fuse. The etching step in FIG. 2A and FIG. 2B is performed simultaneously. In order to form the bonding pad, as shown in FIG. 2B, the second anti-reflective coating 30 on the second metal layer 29 must be removed thoroughly. So the etching step using an etchant including $CF_4$, $CHF_3$, and Ar together with $N_2$ is performed to overetch for additional one minute. So at least 5000 angstroms of the oxide layer in the IPO layer 21 is removed by the etching loss.

The oxide layer above the embedded poly-2 fuse layer 5 shown in FIG. 1 must be maintained greater than 4500 angstroms, but the etching step using the traditional etchant presents difficulties in controlling the thickness of the oxide layer above the buried poly-2 fuse layer 5. Besides, the oxide loss resulting from the etching step using the traditional etchant cannot control the thickness of the oxide layer because the second anti-reflective coating 30 in FIG. 2B must be thoroughly removed. Oxide loss must be carefully controlled. On the other hand, to ensure the thoroughly removal of the anti-reflective coating (TiN layer), the overetching step using traditional etchant must be utilized. So, control of the thickness of the oxide layer in the passivation layer is very difficult.

SUMMARY OF THE INVENTION

The invention provides a method for controlling the thickness of a $SiO_2$ or SiN passivation layer that has an underlying embedded fuse in a semiconductor device. The anti-reflective coating on a metal layer is buried in the passivation layer, and the fuse is in the semiconductor device.

The method includes the following steps. First, use a first etchant and Ar to etch the passivation layer until the anti-reflective coating is exposed, the first thickness of the passivation layer above the anti-reflective coating is smaller than the second thickness of the passivation layer above the fuse.

Then, utilize a second etchant to etch the anti-reflective coating until the metal layer is exposed. The second etchant has a selectivity ratio between the anti-reflective coating to the passivation layer of at least 10 to 1. The second etchant mentioned above includes $Cl_2$, $O_2$, $BCl_3$ and Ar. Because the oxide loss is reduced due to selectivity of the etchant, the thickness of the passivation layer on the semiconductor wafer is well controlled when etching the anti-reflective coating on the metal layer.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Traditional oxide etchant such as $C_4F_8$, $CF_4$ and $CHF_3$ together with the Ar are used to etch the oxide layer in the fuse window and anti-reflective coating (such as TiN layer) on the metal layer. As a result, there is oxide loss of the oxide layer in the passivation layer, and thickness control of the oxide layer in the passivation layer is difficult. CVD, silicon oxide or plasma enhanced CVD silicon nitride is laid down on the wafer surface as the passivation layer.

Figure 1:
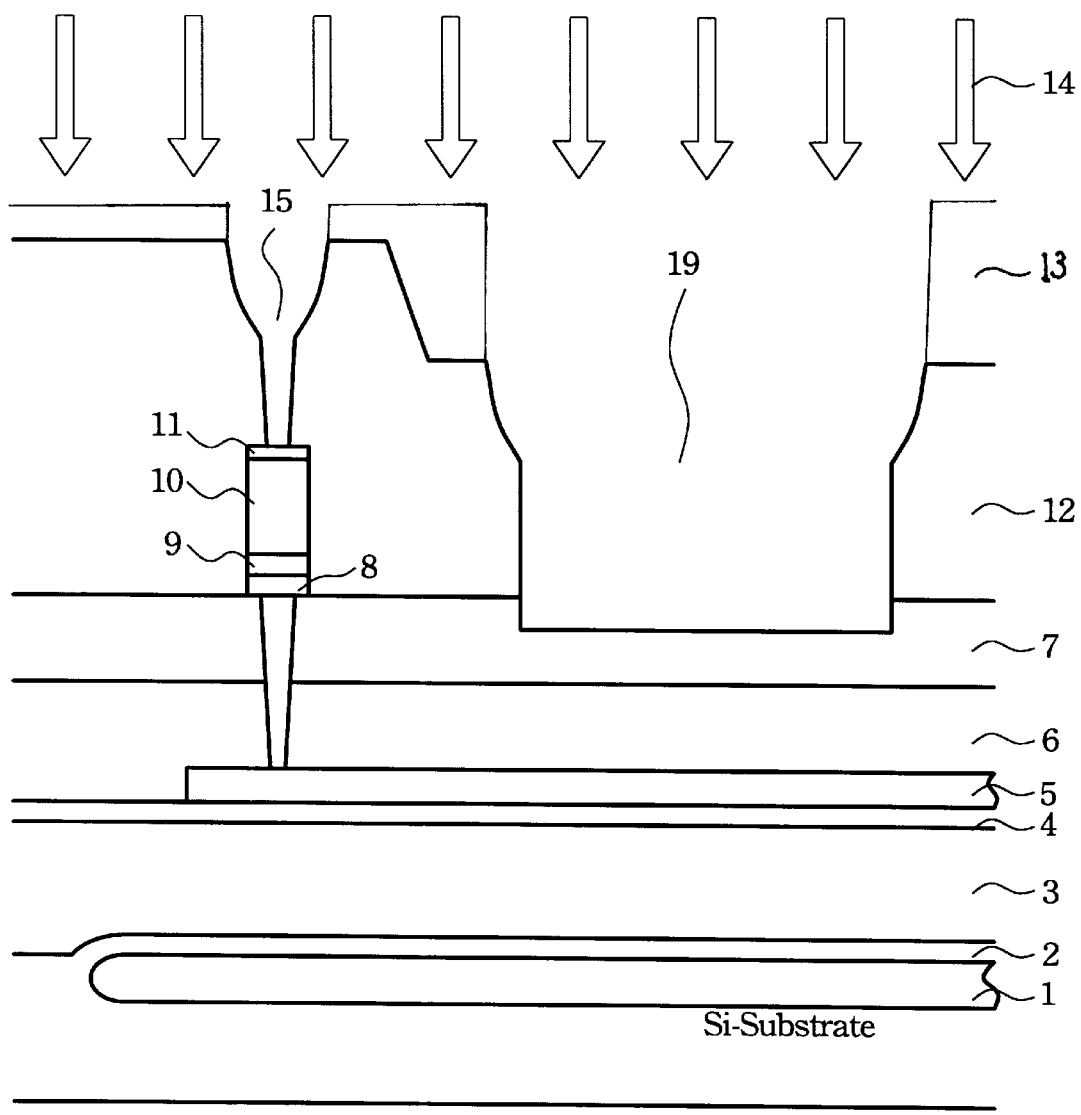
FIG. 1 illustrates a cross sectional view of a semiconductor wafer with the anti-reflective coating and the silicon dioxide passivation layer underlying with the embedded fuse simultaneously etched by the traditional etchant.
Figure 2A:
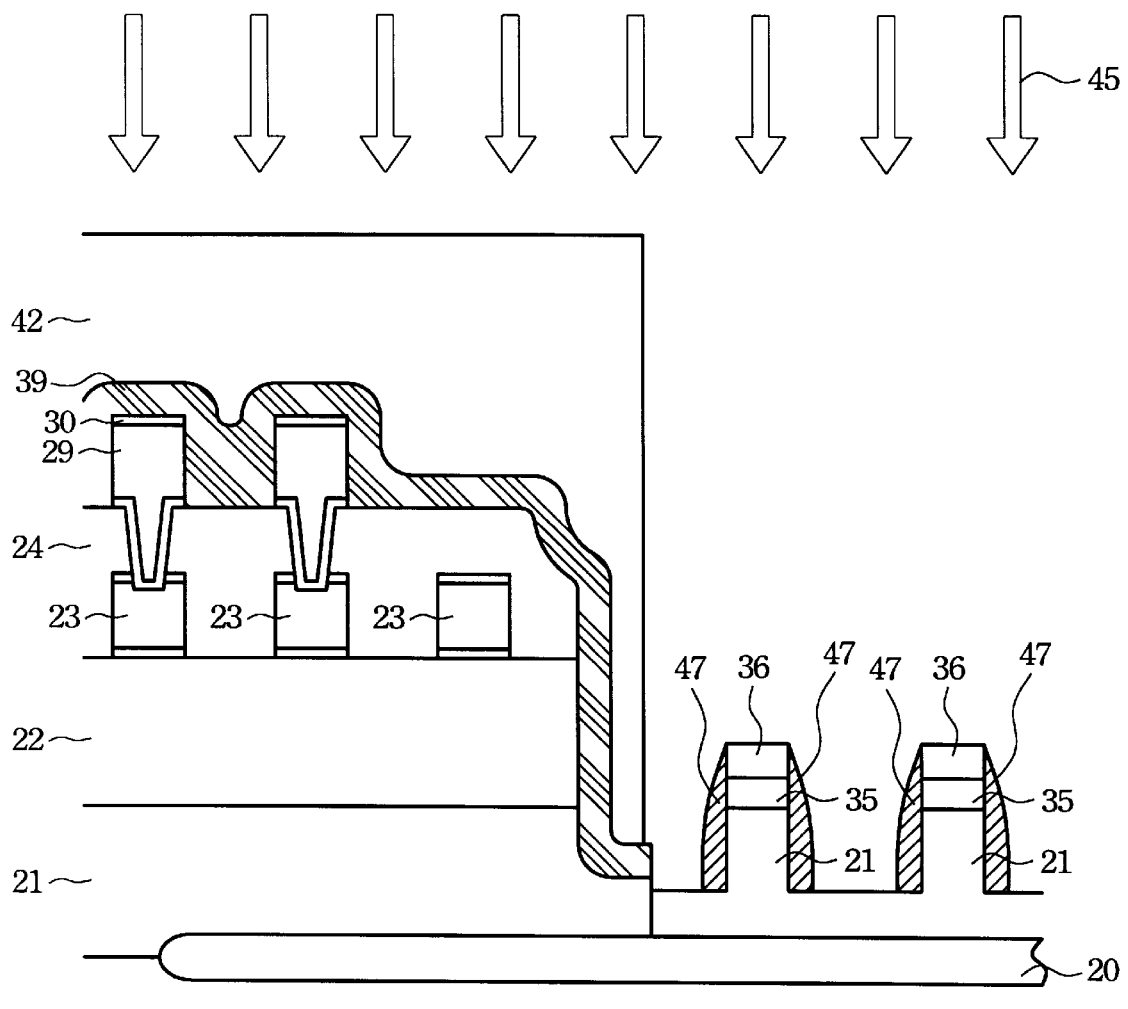
FIG. 2A illustrates the cross sectional view of the first portion of the semiconductor wafer containing the raised fuse, on which the silicon nitride passivation layer is etched by the traditional etchant.
Figure 2B:
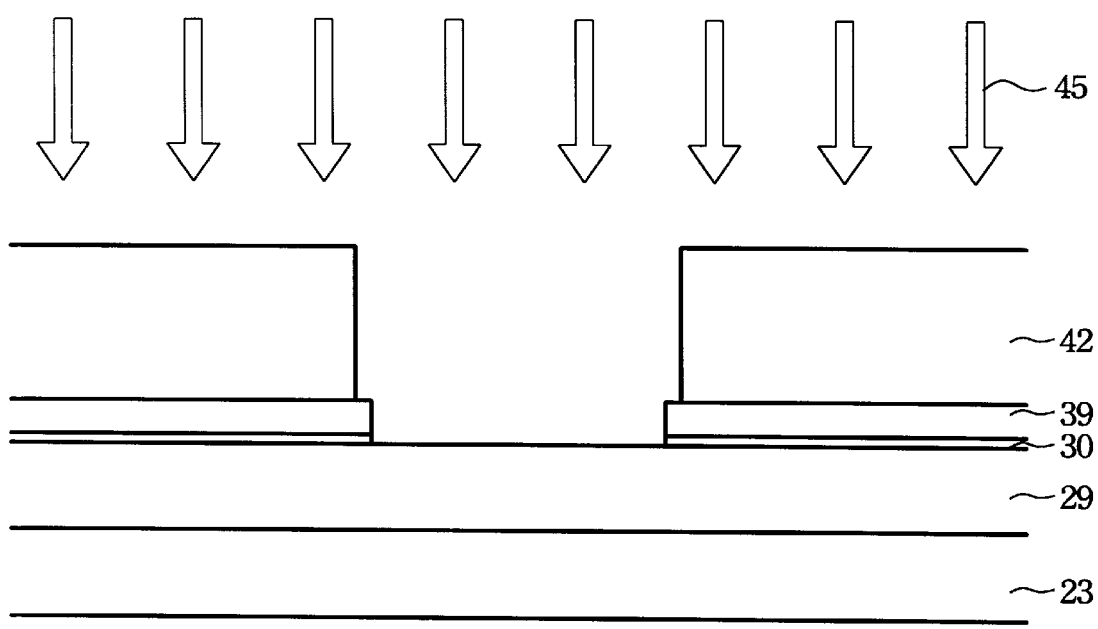
FIG. 2B illustrates the cross sectional view of the second portion of the semiconductor wafer containing the bonding pad of the semiconductor wafer, the silicon nitride passivation layer and the anti-reflective coating (metal layer) of the semiconductor wafer are etched by the traditional etchant.
Figure 3A:
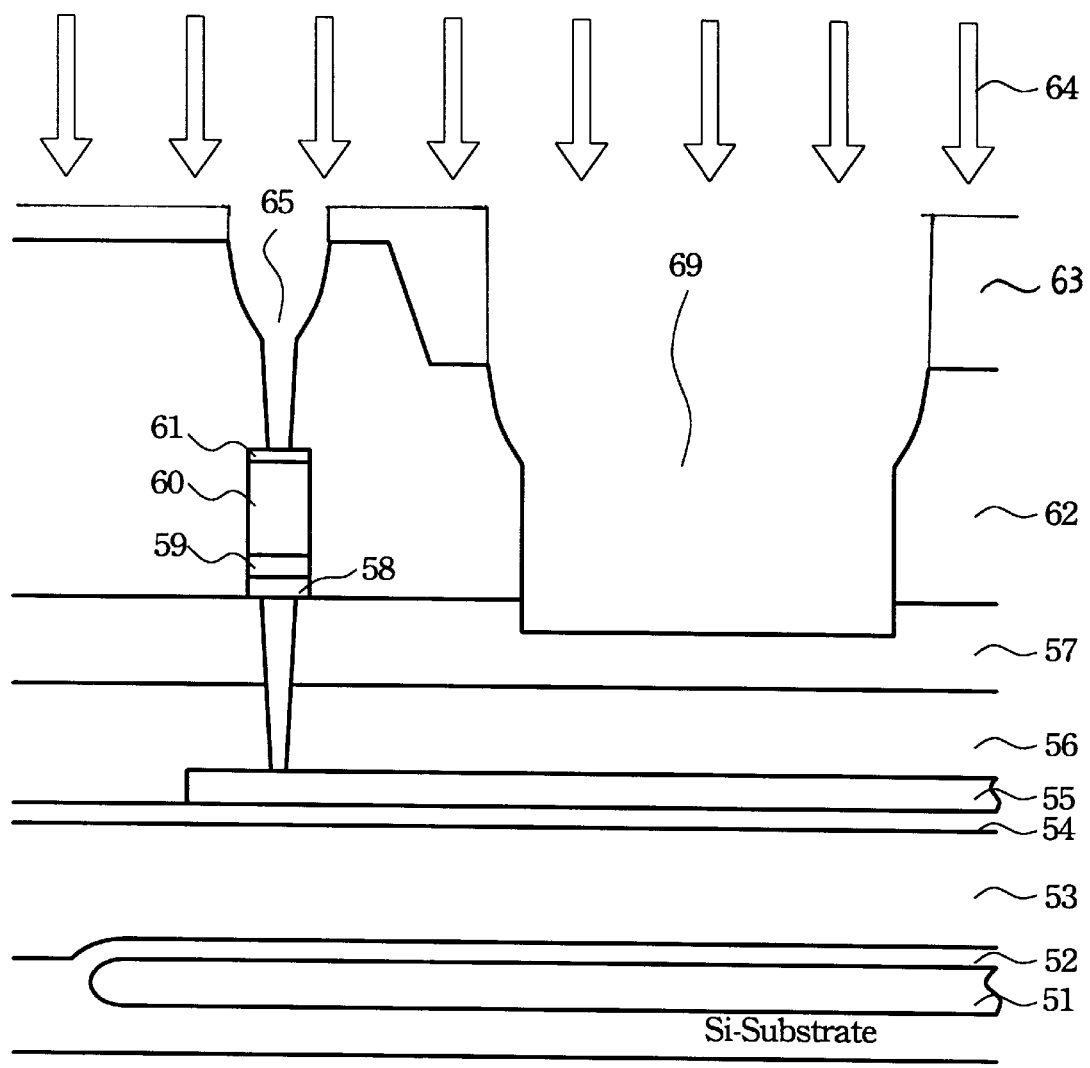
FIG. 3A illustrates the cross sectional view of the semiconductor wafer that the silicon dioxide passivation layer is etched by the oxide etchant (first etchant) until the first anti-reflective coating is exposed.

As shown in FIG. 3A, the cross sectional view of the wafer is the typical wafer for fabricating a memory cell with the embedded fuse in the wafer. The field oxide layer 51 formed on the Si-substrate is about 2150 angstroms in thickness, the thickness of the TEOS oxide layer 52 formed on the field oxide layer 51 is about 1000 angstroms. The thickness of the IPO1 (Inter poly-Si Oxide) BPSG layer 53 formed on the TEOS oxide layer 52 is about 5100 angstroms, and the IPO1-1 BPSG layer 54 formed on the IPO1 BPSG layer 53 is about 1000 angstroms in thickness.

The thickness of the poly-2 fuse layer 55 formed on the IPO1-1 BPSG 54 is about 1500 angstroms in thickness, the IPO2 BPSG layer 56 formed on the poly-2 fuse layer 55 is about 4000 angstroms in thickness. The ILD (Inter Layer Dielectric) layer 57 formed on the IPO2 BPSG layer 56 is about 11000 angstroms in thickness, and the metal barrier Ti layer 58 patterned on the ILD layer 57 is about 1000 angstroms in thickness. The TiN layer 59 patterned on the Ti layer 58 is about 600 angstroms in thickness, and the first metal layer 60 is patterned on the TiN layer 59. The first anti-reflective coating 61 that is patterned on the first metal layer 60 is about 300 angstroms in thickness, and the thickness of the IMD (Inter Metal Dielectric) layer 62 formed on the first anti-reflective coating 61 and the ILD layer 57 is about 11000 angstroms in thickness. The first metal layer 60 is usually made of the alloy AlCu, and the first anti-reflective coating 61 is frequently formed of TiN in fabricating memory cell.

Next, the photoresist is coated on the topography of the wafer and is developed to form the photoresist mask by using photo mask (not shown). Then the photoresist pattern 63 is formed and the oxide etchant 64 is used to etch the portion of the IMD layer that is not covered by the photoresist pattern 63 to fabricate the via contact 65 and the fuse window 69 simultaneously. The ILD layer 57 as well as the IPO2 BPSG layer 56 are to be etched in the foregoing etching step. According to the prior art of forming the via contact window 65, the recipe used to etch the IMD layer 62 is the etchant including $C_4F_8$, $CF_4$, $CHF_3$, and Ar. In order to remove the TiN anti-reflective layer in the first anti-reflective coating 61, the forgoing recipe is used as the oxide etchant 64 to etch the TiN anti-reflective layer in the first anti-reflective coating 61. According to the preferred embodiment of the present invention, when the recipe including Ar together with $C_4F_8$, $CF_4$, $CHF_3$ are used as the oxide etchant 64 to etch the IMD layer 62, the control in the forgoing etching step is a time mode etching step. Thus, the silicon dioxide above the first anti-reflective coating 61 is completely removed.

Figure 3B:
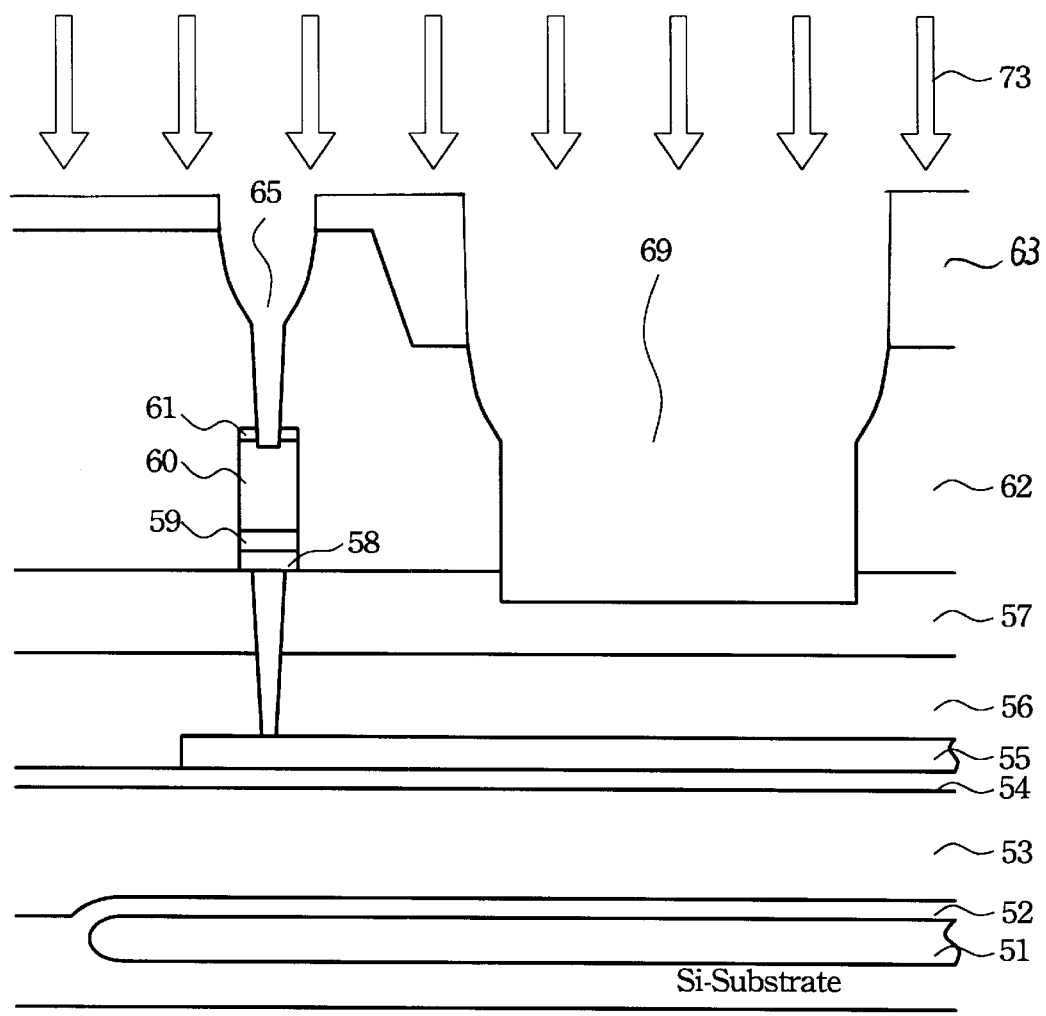
FIG. 3B illustrates the cross sectional view of the semiconductor wafer that the first anti-reflective coating is further etched until the first anti-reflective coating is thoroughly removed by the second metal etchant.

Subsequently the metal etchant 73 that composed of $BCl_3$, $Cl_2$, $O_2$, and Ar is used in the next etching step to etch the first anti-reflective coating 61. Since the selectivity ratio of the metal etchant 73 from the anti-reflective coating (TiN titanium nitride layer) to the oxide layer is at least 10, and the thickness of the first anti-reflective coating 61 is about 300 angstroms. So it is easy to control the oxide loss of the oxide layer in the fuse window 69 less than 30 angstroms. As shown in FIG. 3B, the first anti-reflective coating 61 at the bottom of the via contact window 65 is easily removed by the metal etchant 73 and the oxide loss in the fuse window 69 is easily controlled below 30 angstroms.

According to the two step-etching process which is subsequently utilizing the oxide etchant and the metal etchant in the preferred embodiment of the present invention, the oxide loss in the fuse window is easily controlled in the available thickness. Thus the oxide layer above the poly-2 fuse layer 55 is remained more than about 5000 angstroms. In addition, even the combination or nitrous-combination of the other material, such as W (tungsten), Al (aluminum), Ti (titanium), Mo (molybdenum), or Co (cobalt) is used to manufacture the first anti-reflective coating, the metal etchant according to the preferred embodiment of the present invention can etch the anti-reflective coating also. The two step etching and the metal etchant used in the preferred embodiment of the present invention can avoid further oxide loss in the fuse window area. Especially when the low cost is considered, the 1-mask passivation procedure is used to form the fuse window, and the necessary thickness of the oxide layer above the poly-2 fuse layer is precisely controlled in the required thickness. In the preferred embodiment of the present invention, the passivation layer above poly-Si fuse is formed of silicon dioxide. Even the passivation layer is formed of silicon nitride, the method according to the preferred embodiment of the present invention will have the same result.

When the technology progresses into the ULSI technology, the density of bonding pad connecting to the Au wire is getting higher and the area of the opening in the bonding pad is getting smaller. The two step etching used in the preferred embodiment of the present invention can thoroughly remove the anti-reflective coating without silicon oxide loss in fuse window, so the technology according to the present invention is suitable in this request. When the raised fuse is used in the wafer, the thickness control of the oxide layer in the fuse window is important, because of the oxide layer can protect the underlying device in the wafer from damage and moisture. So the two step etching and the metal etchant used in the preferred embodiment of the present invention can used to precisely control the thickness of the passivation layer when etching the anti-reflective coating together with the oxide layer above the fuse layer in the fuse window.

As will be understood by persons skilled in the art, the foregoing preferred embodiment of the present invention is illustrative of the present invention rather than limiting the present invention. Having described the invention in connection with a preferred embodiment various material is used as the anti-reflective coating or the various recipe is used to etch the titanium nitride (TiN) layer, the oxide layer or the silicon nitride layer in order to form the fuse window and the via opening. The modification will now suggest itself to those skilled in the art. While the preferred embodiment of the invention has been illustrated and described, it will be appreciated that various changes can be made therein without departing from the spirit and scope of the invention.

What is claimed is:

1. A method for controlling a thickness of a passivation layer, the method comprising:

forming a passivation layer over a fuse layer and an anti-reflective coating of a semiconductor device, the anti-reflective layer being formed on a metal layer, the passivation layer being thicker over the anti-reflective coating relative to over the fuse layer;

performing a first etching step using a first etchant and Ar to etch the passivation layer to expose thereby the anti-reflective coating; and performing a second etching step using a second etchant to etch the anti-reflective coating to expose the metal layer, the second etchant comprising at least one of the gases of the group consisting of $Cl_2$, $O_2$, $BCl_3$, and Ar.

2. The method of claim 1 wherein the second etchant is a combination of gases selected from the group consisting of $Cl_2$, $O_2$, $BCl_3$, and Ar.

3. The method of claim 1 wherein the second etchant has a selectivity ratio of the anti-reflective coating to the passivation layer of at least 10.

4. The method of claim 1 wherein the anti-reflective coating comprises at least one of the materials selected from the group consisting of tungsten, titanium, molybdenum and cobalt.

5. The method of claim 1 wherein the passivation layer has a thickness over the fuse layer of at least 5000 angstroms after the first and second etching steps are performed.

6. The method of claim 1 wherein the first etchant comprises at least one of gases selected from the group consisting of $C_4F_8$, $CF_4$, $CHF_3$ and Ar.

7. The method of claim 1 wherein the first etchant is a combination of gases selected from the group consisting of $C_4F_8$, $CF_4$, $CHF_3$ and Ar.

8. A method for controlling a thickness of a passivation layer, the method comprising:

forming a passivation layer over a fuse layer and an anti-reflective coating of a semiconductor device, the anti-reflective layer being formed on a metal layer, the passivation layer being thicker over the anti-reflective coating relative to over the fuse layer, the passivation layer comprising at least one of the materials selected from the group consisting of silicon dioxide and silicon nitride;

performing a first etching step using a first etchant and Ar to etch the passivation layer to expose thereby the anti-reflective coating; and performing a second etching step using a second etchant to etch the anti-reflective coating to expose the metal layer, the second etchant comprising at least one of the gases of the group consisting of $Cl_2$, $O_2$, $BCl_3$, and Ar, the second etchant having a selectivity ratio of at least 10 for the anti-reflective coating over the passivation layer.

9. The method of claim 8 wherein the second etchant is a combination of gases selected from the group consisting of $Cl_2$, $O_2$, $BCl_3$, and Ar.

10. The method of claim 8 wherein the anti-reflective coating comprises at least one of the materials selected from the group consisting of tungsten, titanium, molybdenum and cobalt.

11. The method of claim 8 wherein the anti-reflective coating has a thickness of about 300 angstroms.

12. The method of claim 8 wherein the passivation layer has a thickness over the fuse layer of at least 5000 angstroms after the first and second etching steps are performed.

13. The method of claim 8 wherein the first etchant is a combination of gases selected from the group consisting of $C_4F_8$, $CF_4$, $CHF_3$ and Ar.

14. A method for removing an anti-reflective coating formed on a metal layer and buried in a passivation layer, the passivation layer also covering a fuse layer so as to be thicker over the anti-reflective coating than over the fuse layer, the method comprising:

performing a first etching step using a first etchant and Ar to etch the passivation layer to expose thereby the anti-reflective coating without exposing the fuse layer; and performing a second etching step using a second etchant to etch the anti-reflective coating to expose the metal layer, the second etchant comprising at least one of the gases of the group consisting of $Cl_2$, $O_2$, $BCl_3$, and Ar, the second etchant having a selectivity ratio of at least 10 for the anti-reflective coating over the passivation layer.

15. The method of claim 14 wherein the second etchant is a combination of gases selected from the group consisting of $Cl_2$, $O_2$, $BCl_3$, and Ar.

16. The method of claim 14 wherein the anti-reflective coating comprises at least one of the materials selected from the group consisting of tungsten, titanium, molybdenum and cobalt.

17. The method of claim 14 wherein the anti-reflective coating is selected from the group consisting of tungsten, titanium, molybdenum and cobalt.

18. The method of claim 14 wherein the anti-reflective coating has a thickness of about 300 angstroms.

19. The method of claim 14 wherein the first etchant comprises at least one of gases selected from the group consisting of $C_4F_8$, $CF_4$, $CHF_3$ and Ar.

20. The method of claim 14 wherein the first etchant is a combination of gases selected from the group consisting of $C_4F_8$, $CF_4$, $CHF_3$ and Ar.

* * * * *